US010079028B2

(12) United States Patent
Anushiravani et al.

(10) Patent No.: US 10,079,028 B2
(45) Date of Patent: Sep. 18, 2018

(54) SOUND ENHANCEMENT THROUGH REVERBERATION MATCHING

(71) Applicant: ADOBE SYSTEMS INCORPORATED, San Jose, CA (US)

(72) Inventors: Ramin Anushiravani, San Jose, CA (US); Paris Smaragdis, San Jose, CA (US); Gautham Mysore, San Jose, CA (US)

(73) Assignee: Adobe Systems Incorporated, San Jose, CA (US)

( * ) Notice: Subject to any disclaimer, the term of this patent is extended or adjusted under 35 U.S.C. 154(b) by 147 days.

(21) Appl. No.: 14/963,175

(22) Filed: Dec. 8, 2015

(65) Prior Publication Data

US 2017/0162213 A1 Jun. 8, 2017

(51) Int. Cl.

| | |
|---|---|
| ***H04R 1/40*** | (2006.01) |
| ***G10L 21/057*** | (2013.01) |
| ***G10L 25/48*** | (2013.01) |
| ***H04S 7/00*** | (2006.01) |
| *H03G 5/00* | (2006.01) |
| *G10L 21/0208* | (2013.01) |

(52) U.S. Cl.

CPC ............ *G10L 21/057* (2013.01); *G10L 25/48* (2013.01); *H04S 7/305* (2013.01); *G10L 2021/02082* (2013.01); *H04S 2400/15* (2013.01)

(58) Field of Classification Search

CPC .................. G10L 21/057; G10L 25/48; G10L 2021/02082; H04S 7/305; H04S 2400/15

USPC ........................................ 381/66, 97, 61, 63

See application file for complete search history.

(56) References Cited

U.S. PATENT DOCUMENTS

| | | | | |
|---|---|---|---|---|
| 9,601,124 B2 | 3/2017 | Germain et al. | | |
| 2012/0063608 A1* | 3/2012 | Soulodre | .................. | G01H 7/00 381/66 |
| 2012/0275613 A1* | 11/2012 | Soulodre | .................. | G01H 7/00 381/63 |

(Continued)

OTHER PUBLICATIONS

Abd El-Fattah, M. A., Dessouky, M. I., Diab, S. M., & Abd El-Samie, F. E. S. (2008). Speech enhancement using an adaptive wiener filtering approach. Progress in Electromagnetics Research, 4, 167-184.

(Continued)

*Primary Examiner* — Vivian Chin
*Assistant Examiner* — Ammar Hamid
(74) *Attorney, Agent, or Firm* — Shook, Hardy & Bacon, L.L.P.

(57) ABSTRACT

Embodiments of the present invention relate to enhancing sound through reverberation matching. In sonic implementations, a first sound recording recorded in a first environment is received. The first sound recording is decomposed to a first clean signal and a first reverb kernel. A second reverb kernel corresponding with a second sound recording recorded in a second environment is accessed, for example, based on a user indication to enhance the first sound recording to sound as though recorded in the second environment. An enhanced sound recording is generated based on the first clean signal and the second reverb kernel. The enhanced sound recording is a modification of the first sound recording to sound as though recorded in the second environment.

20 Claims, 7 Drawing Sheets

(56) References Cited

U.S. PATENT DOCUMENTS

2016/0073198 A1* 3/2016 Vilermo ................ H04R 5/027 381/26

OTHER PUBLICATIONS

Dietzen, T., Huleihel, N., Spriet, A., Tiny, W., Doclo, S., Moonen, M., & van Waterschoot, T. (Aug. 2015). Speech dereverberation by data-dependent beamforming with signal pre-whitening. In Signal Processing Conference (EUSIPCO), 2015 23rd European (pp. 2461-2465). IEEE.

Ephraim, Y., & Malah, D. (1984). Speech enhancement using a minimum-mean square error short-time spectral amplitude estimator. IEEE Transactions on acoustics, speech, and signal processing, 32(6), 1109-1121.

Esch, T., & Vary, P. (Apr. 2009). Efficient musical noise suppression for speech enhancement system. In Acoustics, Speech and Signal Processing, 2009. ICASSP 2009. IEEE International Conference on (pp. 4409-4412). IEEE.

Gaubitch, N. D., & Naylor, P. A. (Sep. 2005). Analysis of the dereverberation performance of microphone arrays. In Proc. Intl. Workshop Acoust. Echo Noise Control (IWAENC).

Gaubitch, N. D., Naylor, P. A., & Ward, D. B. (Sep. 2003). On the use of linear prediction for dereverberation of speech. In Proc. Int. Workshop Acoust. Echo Noise Control (vol. 1, pp. 99-102).

Habets, E A. (2010). Single-microphone Spectral Enhancement. In P. Naylor, N. D. Gaubitch (Eds.) Speech Dereverbartion (pp. 64-71). London, England: Springer-Verlag.

Habets, E A., & Benesty, J. (May 2011). Joint dereverberation and noise reduction using a two-stage beamforming approach. In Hands-free Speech Communication and Microphone Arrays (HSCMA), 2011 Joint Workshop on (pp. 191-195). IEEE.

Kollmeier, B., Peissig, J., & Hohmann, V. (1993). Real-time multiband dynamic compression and noise reduction for binaural hearing aids. Journal of Rehabilitation Research and Development, 30(1), 82.

Lee, D. D., & Seung, H. S. (2001). Algorithms for non-negative matrix factorization. In Advances in neural information processing systems (pp. 556-562).

Liang, D., Hoffman, M. D., & Mysore, G. J. (Apr. 2015). Speech dereverberation using a learned speech model. In Acoustics, Speech and Signal Processing (ICASSP), 2015 IEEE International Conference on (pp. 1871-1875). IEEE.

Lu, Y., & Loizou, P. C. (2008). A geometric approach to spectral subtraction. Speech communication, 50(6), 453-466.

Lukin, A., & Todd, J. (Oct. 2007). Suppression of musical noise artifacts in audio noise reduction by adaptive 2-D filtering. In Audio Engineering Society Convention 123. Audio Engineering Society.

Mohammadiha, N., Smaragdis, P., & Doclo, S. (Apr. 2015). Joint acoustic and spectral modeling for speech dereverberation using non-negative representations. In Acoustics, Speech and Signal Processing (ICASSP), 2015 IEEE International Conference on (pp. 4410-4414). IEEE.

Nakatani, T., Yoshioka, T., Kinoshita, K, Miyoshi, M., & Juang, B. H. (Mar. 2008). Blind speech dereverberation with multi-channel linear prediction based on short time Fourier transform representation. In Acoustics, Speech and Signal Processing, 2008. ICASSP 2008. IEEE International Conference on (pp. 85-88). IEEE.

Ratnam, R., Jones, D. L., Wheeler, B. C., O'Brien Jr., W. D., Lansing, C. R., & Feng, A. S. (2003). Blind estimation of reverberation time. The Journal of the Acoustical Society of America, 114(5), 2877-2892.

Smaragdis, P. (2007). Convolutive speech bases and their application to supervised speech separation. IEEE Transactions on Audio, Speech, and Language Processing, 15(1), 1-12.

Smaragdis, P., & Raj, B. (2007). Shift-invariant probabilistic latent component analysis. Journal of Machine Learning Research. 31 pages.

Tonelli, M. (2011). Blind reverberation cancellation techniques (Master's thesis, The University of Edinburgh). Retrieved from <https://www.era.lib.ed.ac.uk/bitstream/handle/1842/5868/Tonelli2012.pdf?sequence=1&isAllowed=y>. 166 pages.

Vaseghi, S. V. (2001). Wiener Filters. Advanced Digital Signal Processing and Noise Reduction, Second Edition, 178-204.

* cited by examiner

SOUND ENHANCEMENT THROUGH REVERBERATION MATCHING

BACKGROUND

Sounds may persist after production in a process known as reverberation, which is caused by reflection of the sound in an environment. For example, speech may be generated by users within a room, outdoors, and so on. After the users speak, the speech is reflected off of objects in the user's environment, and therefore may arrive at different points in time to a sound capture device, such as a microphone. Accordingly, the reflections may cause the speech to persist even after it has stopped being spoken which is noticeable to a user as noise.

When speech is recorded in different rooms or environments, the recordings tend to sound different based on, at least in part, the resulting reverberation due to environment acoustics. It is oftentimes desirable, however, to edit or modify a sound to have a reverberation as though recorded in another environment. For example, when one portion of a voiceover or narration is performed in one environment and another portion of the voiceover or narration is performed in another environment, a consistent reverberation may be desired so that the voiceover or narration sounds as though recorded in a single environment.

SUMMARY

Embodiments of the present invention are directed to enhancing sound through reverberation matching. In this regard, a sound recorded in one environment can be enhanced to sound as though it was recorded in another environment through reverberation matching. For example, a sound recorded in an office can be enhanced to sound as though recorded in an auditorium, or vice versa. To match reverberation to another environment, in implementation, a recorded sound can be decomposed to a clean signal and a reverb kernel. The reverb kernel, which represents reverberation, can be replaced or matched to a reverb kernel associated with a sound recording recorded in a desired environment. In this way, the recording can be enhanced to sound as though recorded in the desired environment.

BRIEF DESCRIPTION OF THE DRAWINGS

The present invention is described in detail below with reference to the attached drawing figures, wherein.

DETAILED DESCRIPTION

Figure 1:
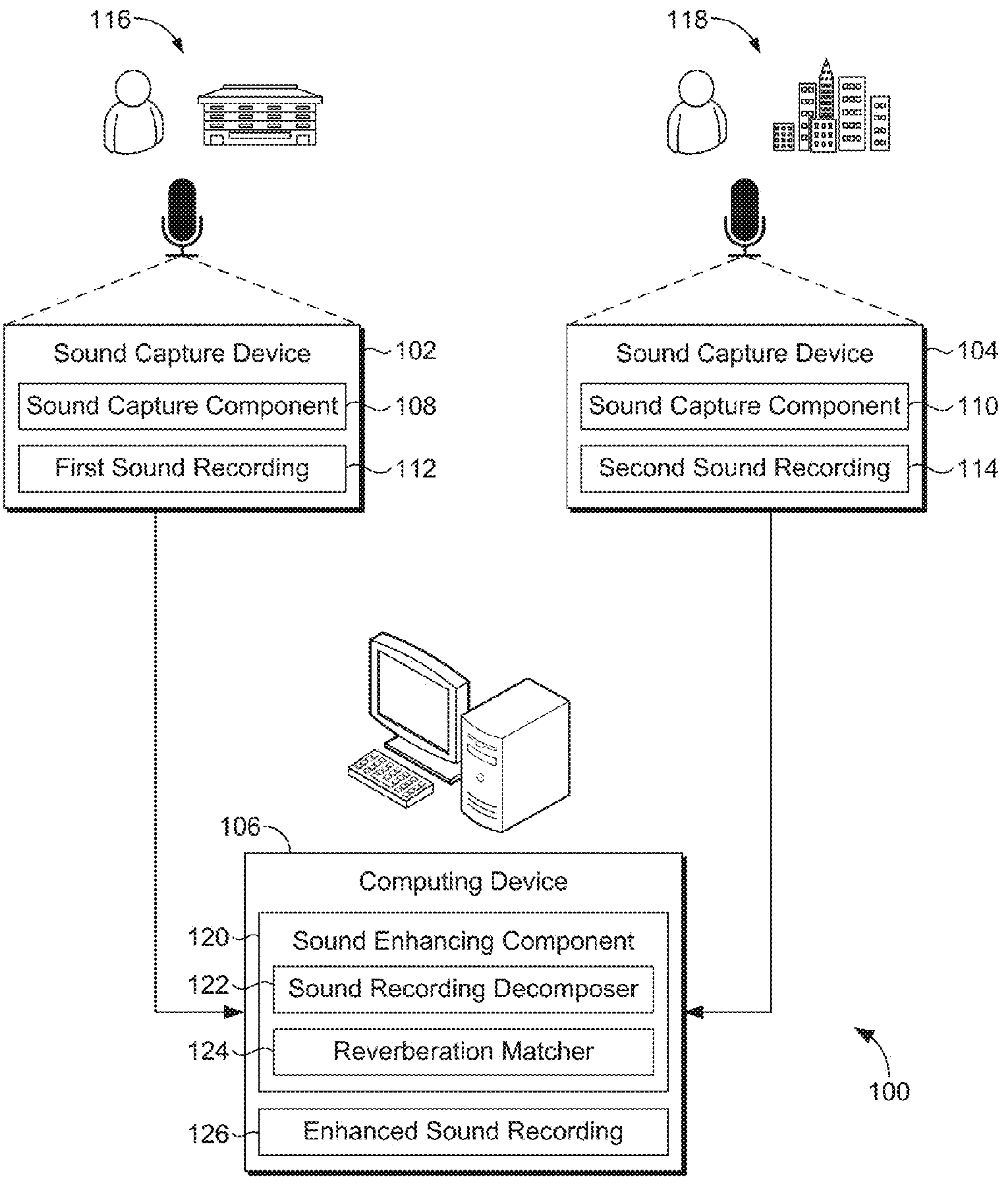
FIG. 1 is an illustration of an example implementation that is operable to employ techniques described herein.

The subject matter of the present invention is described with specificity herein to meet statutory requirements. However, the description itself is not ntended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Sound recorded in different rooms or environments generally sound different due to reverberation caused by different environment acoustics. In this regard, a user's speech arriving at a sound capture device in a first environment may be reflected off of various objects within the environment, while the user's speech arriving at a sound capture device in a second environment may be reflected off of other objects. It is oftentimes desired, however, to accomplish sounds that reflect a same environment.

In an effort to accomplish sounds that reflect a same environment, speech enhancement techniques have been developed to remove the reverberation from sound recordings, in a process known as dereverberation. For example, assume that a first sound recording is captured in a first environment, while a second sound recording is captured in a second environment. To make the second recording sound as though it was recorded in the first environment, prior techniques remove the reverberation from both the first sound recording and the second recording so that the recordings sound the same. Removing reverberation from sound, however, is oftentimes not a desired result as some reverberation is desired to give sound a warmth quality. Further, dereverberation does not enable an audio recording to sound as though recorded in another environment that has a different reverberation, such as, for example, a sound recorded in an office being desired to sound as though recorded in an auditorium.

As such, embodiments of the present invention are directed to enhancing sound through reverberation matching. In this regard, a sound recorded in one environment can he enhanced or edited to sound as though recorded in another environment. For example, in a case where portions of a voiceover are recorded in two separate environments, one portion of the voiceover can be enhanced to sound as though recorded in the same environment as the other. As another example, assume a sound is recorded in a room with poor acoustics. In such a case, embodiments of the present invention can enhance the recording to sound more like it was recorded in a room with pleasant sounding, or desired, acoustics.

In implementation, to facilitate sound enhancement, a sound recording captured in a first environment desired to be enhanced is decomposed into a clean signal and a reverb kernel. The clean signal refers to a signal with the reverberation removed, and the reverb kernel represents the reverberation of that sound recording. To this end, the clean signal is generally a signal with the reverberation substantially, or mostly, removed. To produce an enhanced sound recording that sounds as though the initially captured sound recording was completed in a second environment, the clean signal from the initially captured sound recording can be used along with a reverb kernel of the desired second environment to generate the enhanced sound recording. Using the reverb kernel of the desired second environment results in the originally captured sound recording seeming as though recorded in the desired second environment. In some cases, as opposed to solely using the reverb kernel of the desired second environment, weighted reverb kernels associated with sound recordings in both environments may be used. Utilization of weighted reverb kernels might be used, for example, to adjust or balance the desired reverb effect and/or to suppress potential artifacts due to an imperfect decomposition.

Having briefly described an overview of embodiments of the present invention, an exemplary operating environment in which embodiments of the present invention may be implemented is described below in order to provide a general context for various aspects of the present invention. Referring initially to FIG. 1 in particular, an exemplary operating environment for implementing embodiments of the present invention is shown and designated generally as environment 100. FIG. 1 is an illustration of an environment 100 in an example implementation that is operable to employ reverberation matching techniques described herein. The illustrated environment 100 includes a plurality of sound capture devices 102 and 104 and a computing device 106, which are configurable in a variety of different ways.

The sound capture devices 102 and 104 are configurable in a variety of ways. Illustrated examples of one such configuration involves standalone devices, but other configurations are also contemplated, such as part of a mobile phone, video camera, tablet computer, part of a desktop microphone, array microphone, or the like. Additionally, although the sound capture devices 102 and 104 are illustrated separately from the computing device 106, the sound capture devices 102 and/or 104 may be configured as part of the computing device 106. Further, the sound capturing devices 102 and 104 may be representative of a single sound capture device used in different acoustic environments.

The sound capture devices 102 and 104 are illustrated as including respective sound capture components 108 and 110 that are representative of functionality to generate first and second sound recordings 112 and 114 in this example. The sound capture device 102, for instance, may generate the first sound recording 112 as a recording of an acoustic environment 116 of a user's house, whereas sound capture device 104 generates the second sound recording 114 of an acoustic environment 118 of a user's office. The first and second sound recordings 112 and 114 are provided to the computing device 106 for processing.

The computing device 106 is generally configured to enhance sound via reverberation matching. The computing device 106 may be in any form of device, such as, for instance, configured as a desktop computer, a laptop computer, a mobile device (e.g., a tablet or mobile device), etc. The computing device can range from full resource devices with substantial memory and processor resources (e.g., personal computers, game consoles) to low-resource devices with limited memory and/or processing resources (e.g., mobile devices). Additionally, although a single computing device 106 is shown, the computing device 106 may be representative of a plurality of different devices, such as multiple servers utilized by a business to perform operations over the cloud or in a distributive environment.

The computing device 106 is illustrated as including a sound enhancing component 120. The sound enhancing component 120 is representative of functionality to process the first and second sound recordings 112 and 114. Although illustrated as part of the computing device 106, the functionality represented by the sound enhancing component 120 may be performed, for example, over the cloud by one or more servers that are accessible via a network connection.

An example of functionality of the sound enhancing component 120 is represented as a sound recording decomposer 122 and a reverberation matcher 124. Generally, and at a high level, the sound enhancing component 120 is configured to match reverberation of one sound recording, such as sound recording 112, to another sound recording, such as sound recording 114. As such, one sound recording is enhanced to sound as though recorded in another environment. By way of example only, the first sound recording 112 recorded in the user's house 116 can be enhanced or edited to sound as though recorded in the office environment 118. To facilitate the sound enhancement, the sound recording decomposer 122 decomposes both the first and second sound recordings into a clean signal and a reverb kernel. A clean signal refers to a signal from the sound recording that includes minimal to no noise or other artifacts. In other words, a clean signal does not have a reverberation effect. The reverb kernel refers to a representation of the reverberation in the sound recording. A reverb kernel can also sometimes be referred to as a room response. The reverberation matcher 124 can then match reverberation of one sound recording, such as the first sound recording 112, to that of another sound recording, such as second sound recording 114, to generate an enhanced sound recording 126. To do so, as described herein, the reverb kernel of the second sound recording can be utilized along with the clean signal of the first sound recording to be enhanced to generate the enhanced sound recording 126. The enhanced sound recording 126 then sounds as though recorded in a desired environment, such as the office environment 118.

Figure 2:
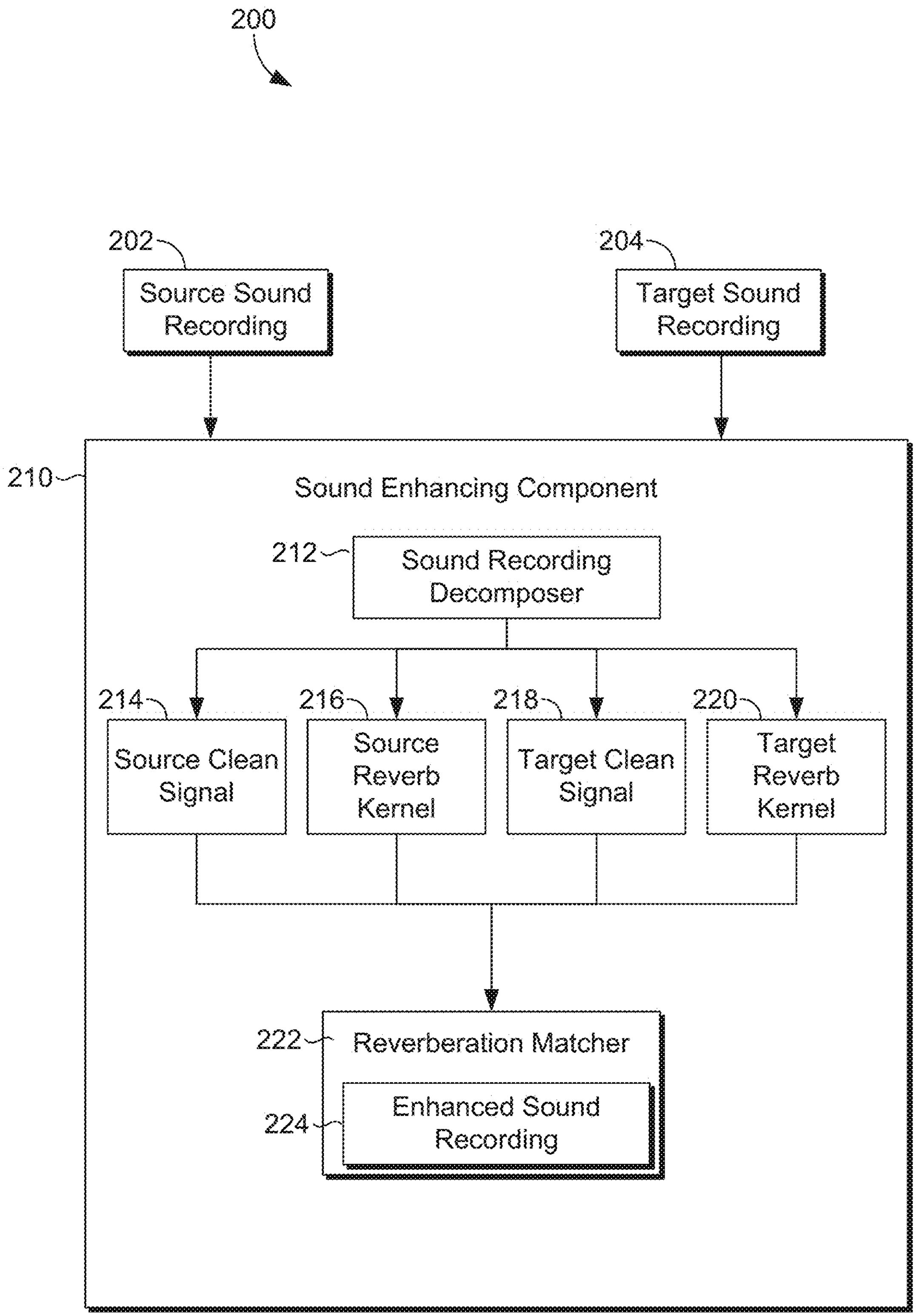
FIG. 2 depicts a system in an example implementation in accordance with embodiments of the present invention.

FIG. 2 illustrates an example system 200 that is configured to perform sound enhancement via reverberation matching, in accordance with embodiments of the present invention. Source sound recording 202 and target sound recording 204 can be any recordings of sound or audio. The sound recordings can be captured by any type of sound capture device, and in any type of environment. As described herein, a source sound recording refers to a sound recording that is intended to be edited or enhanced to match a reverberation of another sound recording. A target sound recording refers to a sound recording that includes a reverberation that is desired or targeted for inclusion in another sound recording. As illustrated in FIG. 2, the source sound recording 202 is a sound recording that is intended to be enhanced to match a reverberation of the target sound recording 204. As such, the source sound recording 202 can be enhanced to sound as though recorded in the environment in which the target sound recording 204 was recorded. Although FIG. 2 illustrates the sound recordings 202 and 204 being indicated as a source sound recording and a target sound recording, respectively, as can be appreciated, the input sound recordings may not be designated as such until a time after Which the sound recordings are provided to the sound enhancing component 210. For example, sound recordings can be provided to the sound enhancing component 210 and, thereafter, designated (e.g., via a user) as a source sound recording and target sound recording. The sound recordings are labeled in FIG. 2 as source sound recording and target sound recording for simplicity in describing embodiments of the present invention.

The source sound recording 202 and target sound recording 204 can be provided to the sound enhancing component 210 in any number of manners and at any time. For example, the sound recordings may be provided by a sound capture device, as described with respect to FIG. 1, or by another device that stores or accesses the sound recordings. Although not illustrated, the sound enhancing component 210 might access the source sound recording 202 and/or target sound recording 204 from a data store locally or remotely (e.g., via a network) accessible to the sound enhancing component.

Upon the sound enhancing component 210 accessing or obtaining the source sound recording 202 and/or the target sound recording 204, the sound recording decomposer 212 can decompose the sound recording(s) into a clean signal and a reverb kernel. As illustrated, the sound recording decomposer 212 decomposes the source sound recording 202 into a source clean signal 214 and a source reverb kernel 216. Similarly, the sound recording decomposer 212 decomposes the target sound recording 204 into a target clean signal 218 and a target reverb kernel 220. As can be appreciated, such decompositions can he performed at any time. For example, the source and target sound recordings can be decomposed at approximately the same time. In another example, the source and target sound recordings can be decomposed at varying times. For example, the target sound recording might be a sound recording that is used as an exemplary recording captured in a particular environment, such as an auditorium. In such a case, a target sound recording might be decomposed, and at a later time, upon receiving a source sound recording, the source sound recording might be decomposed.

Figure 3:
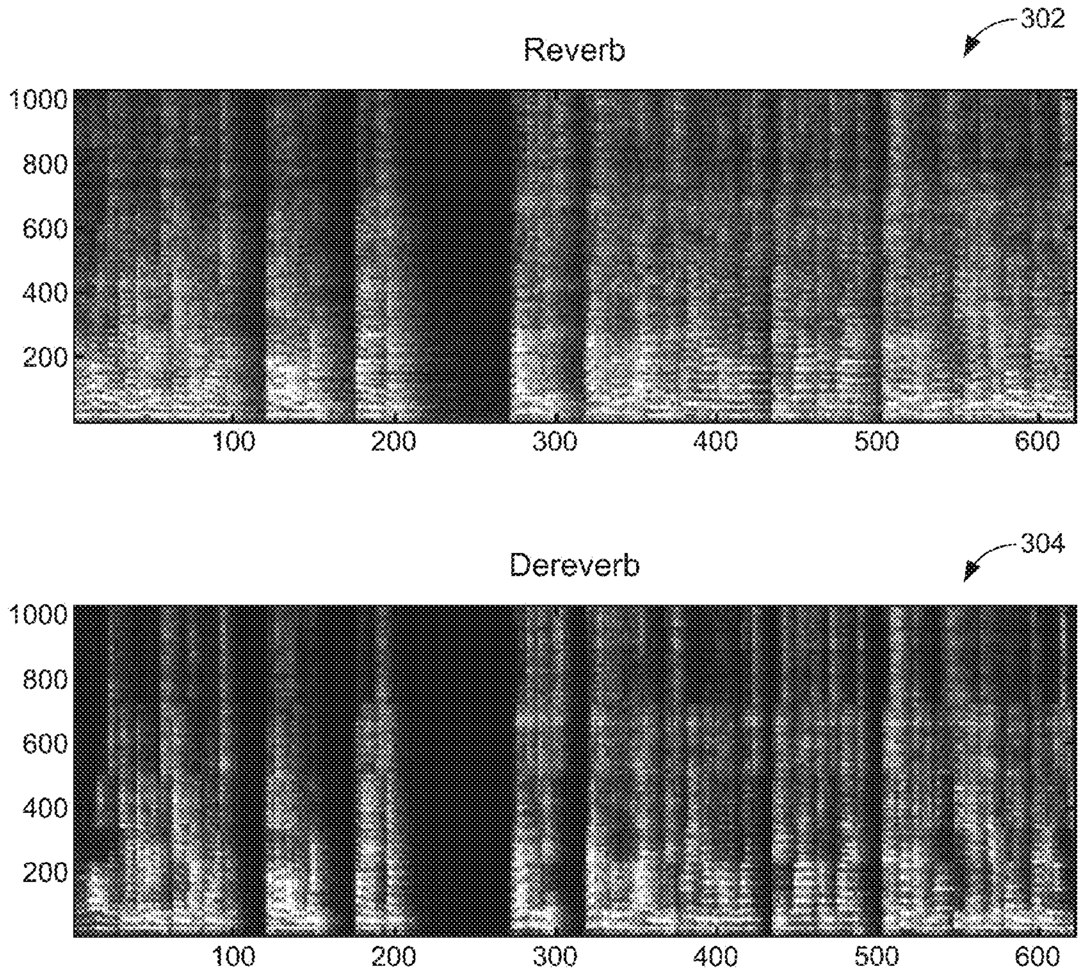
FIG. 3 illustrates example spectograms illustrating a reverb sound and a dereverb sound, in accordance with embodiments of the present invention.

By way of illustration, and with reference to FIG. 3, a sound recording, which may also be referred to as an input sound or a reverb sound, can he visualized by way of spectrogram 302. The sound recording can be decomposed from the reverb sound to a dereverb sound and a reverb kernel. The dereverb sound can be visualized by way of spectrogram 304.

Decomposing a sound recording, for example, by sound recording decomposer 212, into a clean signal and a reverb kernel can be performed in any number of manners, generally by means of dereverberation. Some example dereverberation processes include use of microphone arrays and beamforming techniques; linear prediction; blind deconvolution; $T_{60}$ to model room response; matrix factorization, e.g., using speech models as a prior and performing posterior inference to estimate the room response and the clean signal; and Multiband Dynamic Range Compression (MDRC).

Another example of a dereverberation process to decompose a sound recording into a clean signal and a reverb kernel can utilize convolutive matrix factorization, in particular, a convolutive non-negative matrix factorization. Applying a convolutive non-negative matrix factorization on a reverb sounds results into two positive factors, the clean sound and the reverb sound, which are related through convolution.

Generally, representation of reverberation includes convolution between a clean signal and a reverb kernel. Convolution refers to a function derived from two given functions by integration that can express how the shape of one is modified by the other. Such convolution between a clean signal and a reverb kernel can be a time-domain convolution model approximated using short-time Fourier transform (STFT), as provided below:

$$|Y(t,k)| \approx \sum_{\tau=0}^{L} |H(\tau,k)| \cdot |X(k,t-\tau)| \quad \text{(Equation 1)}$$

wherein Y(t,k) denotes the reverb sound (input sound or sound recording) at frequency k and time t, H denotes reverb kernel, X denotes clean signal, L denotes the length of the reverb kernel in time frame in the STFT domain, and $\tau$ denotes time delay.

To decompose the reverb sound into a clean signal and a reverb kernel, convolutive non-negative matrix factorization (CNMF), an extension of non-negative matrix factorization (NMF), can be used. CNMF is defined based on a row-wise convolution between time frames of two magnitude spectrograms at various frequency bins. Convolutive NMF can be represented via the following equation:

$$Y \approx \sum_{t=0}^{T-1} X(t) \cdot H^{t\rightarrow} \quad \text{(Equation 2)}$$

wherein Y denotes the reverb sound (input sound or sound recording), X denotes clean signal, H denotes reverb kernel, T denotes length of reverb kernel, t denotes time, and $(.^{t\rightarrow})$ denotes a shift operator. The convolutive NMF can be optimized as a set of NMF approximations. The clean signal, X, can initially be a positive random number, and the reverb kernel, H, can initially be a statistical reverb kernel model. Applying the CNMF on the reverb sound will converge to an estimation of X (clean sound) and H (reverb kernel) iteratively (e.g., through 100 iterations) given appropriate priors.

Upon decomposing a source sound recording and a target sound recording into corresponding clean signals and reverb kernels, the reverberation matcher 222 is generally configured to match the reverberation of one sound recording to the reverberation of another sound recording. In particular, with reference to FIG. 2, the reverberation matcher 222 matches the reverberation of the source sound recording 202 to the reverberation of the target sound recording 204. As such, the reverberation associated with the source sound recording 202 and the target sound recording 204 are matched to have the same amount of reverberation so that the sound recordings sound as though captured in the same environment (e.g., a particular room).

A reverb kernel can be used to match reverberation. In this regard, reverberation matcher 222 can be match reverberation using the reverb kernel 220 of the target sound recording with the clean signal 214 of the source sound recording to generate an enhanced sound recording 224. In other words, the source reverb kernel can be replaced with the target reverb kernel to generate an enhanced sound recording. An enhanced sound recording refers to an initial sound recording that is edited or modified to have a different reverberation than originally recorded such that the enhanced sound recording sounds as though recorded in a different environment. Although FIG. 2 is illustrated with each of source dean signal 214, source reverb kernel 216, target clean signal 218, and target reverb kernel 220 being communicated to the reverberation matcher 222, as can be appreciated, the reverberation matcher 222 can access any number of data. For instance, the reverberation matcher 222 might only access source clean signal 214 and target reverb kernel 220.

An enhanced sound recording, such as enhanced sound recording 224, can he generated in any number of manners that use a clean signal in combination with a target reverberation corresponding with a desired recording or environment. As described above, assume the source sound recording and the target sound recording are both decomposed into a clean signal and a reverb kernel. Such a decomposition may be denoted by the following equations:

$$\begin{cases} Y_A(t,k) = \sum_{\tau=0}^{T_A-1} X_A(t-\tau,k)\cdot H_A(\tau,k) \\ Y_B(t,k) = \sum_{\tau=0}^{T_B-1} X_B(t-\tau,k)\cdot H_B(\tau,k) \end{cases} \quad \text{(Equation 3)}$$

wherein $Y_A$ and $Y_B$ are magnitude spectrograms of the two reverb or recorded sounds in environment A and environment B, respectively; $X_A$ and $X_B$ denote magnitude spectrograms of the clean signals in environment A and environment B, respectively; and $H_A$ and $H_B$ denote magnitude spectrograms of the reverb kernels in environment A and environment B, respectively.

To generate an enhanced sound recording, the sound recording in environment A can be enhanced to sound as if it was recorded in the same environment in which the sound recording in environment B was recorded. One example for generating an enhanced sound recording is provided below:

$$\hat{y}_a(t,k)=\Sigma_{\tau=0}^{T-1}X_A(T-\tau,k)\cdot H_B(\tau,k) \quad \text{(Equation 4)}$$

wherein $\hat{y}_a$(t, k) denotes a magnitude spectrogram of $x_a(n)$, which is the time domain of $X_A(t-\tau, k)$, as if it was recorded in the same environment B as where $y_b(n)$, which is the time domain of $Y_B(t, k)$, was recorded. As shown, a clean signal of environment A ($X_A$) is used along with a reverb kernel of environment B ($H_B$) to generate an enhanced sound recording $\hat{y}_a$(t, k). Because $\hat{y}_a$ is missing phase, to take the result back to time domain $y_a(n)$ so that it is audible, an inverse transformation, such as Inverse Short-Time Fourier Transformation (ISTFT), of $\hat{y}_a$ using $Y_A$ (the original reverb signal spectrogram) phase instead (which is possible since the human auditory system is insensitive to phase distortions in speech signal), can result in a time representation as though recorded in environment B:

$$\hat{y}_a(n)=ISTFT(\hat{Y}_A(t,k)\cdot(Y_{AC}./|Y_A|)). \quad \text{(Equation 5)}$$

wherein $\hat{y}_a(n)$ is a vector representing an audible sound, $Y_{AC}$ is the complex-value of $Y_A$, and './' is an element-wise division.

Because decomposition of sound recordings into clean signals may not result in a completely clean signal in that the estimated clean signal may contain some of the reverb kernel components (e.g., the reverberation is substantially, but not completely, removed), a weighted average of the target and source reverb kernels can be applied to both recordings, in some embodiments. For instance, equation 6 below provides one example of applying a weighted average of reverb kernels to a sound recorded in environment A and a sound recorded in environment B.

$$\begin{cases} Y_A(t,k) = \sum_{\tau=0}^{T_C-1} X_A(t-\tau)\cdot H_C(\tau,k) \\ Y_B(t,k) = \sum_{\tau=0}^{T_D-1} X_B(t-\tau)\cdot H_D(\tau,k) \end{cases} \quad \text{(Equation 6)}$$

wherein $H_C$ and $H_D$ denote the magnitude spectrograms of a weighted average of the reverb kernels, in particular, $H_C=\alpha_1\cdot H_A+\alpha_2\cdot H_B$ and $H_d=\beta_1\cdot H_A+\beta_2\cdot H_B$. Here, $\alpha_1$ and $\beta_1$ are matrices of the same size as $H_A$, and $\beta_1$ and $\alpha_1$ are matrices of the same size as $H_B$. The elements in the alphas and betas can follow three rules: (1) elements in each column of the matrix are equivalent (different columns might take different values), (2) each element can take values between 0 and 1, and (3) element addition between a column of alpha with its corresponding column in beta should result in a vector of ones. In this regard, rather than replacing the reverb kernel with a reverb kernel decomposed from a desired environment to match reverberation, a weighted average of both reverb kernels can be used, for instance, in an effort to reduce artifacts. As can be appreciated, if $\alpha_1$ equals 1, $\alpha_2$ equals 0, $\beta_1$ equals 0, and $\beta_2$ equals 1, then $H_c$ equals $H_A$, which is the previously estimated clean signal. Generally, the elements of $\alpha$ and $\beta$ weights are values between 0 and 1 and, when totaled, equal one. In some cases, the $\alpha$ and $\beta$ weights might be designated by a user that may desire to adjust or balance the desired reverb effect, while suppressing possible artifacts due to a poor decomposition. In other cases, the $\alpha$ and $\beta$ weights might be determined. One example for calculating the $\alpha$ and $\beta$ weights can use the following algorithm, assuming $Y_B$ has more reverb than $Y_A$:

1. Set $\alpha_1$ to 1, the first column of $\alpha_2$ to 1, and the remaining columns of $\alpha_2$ to $T_{60}(B)/T_{60}(A)$
2. Set $\beta_1$ to 1, the first column of $\beta_2$ to 1, and the remaining columns of $\beta_2$ to $T_{60}(A)/T_{60}(B)$ As can be appreciated, artifacts and other noise may be also be removed or suppressed in any number of manners to produce the enhanced sound recording. $T_{60}$ (the reverberation time) can be estimated using, for example, state of the blind estimation, as is known in the art.

Upon generating the enhanced sound recording 224, the enhanced sound recording can he provided or output to, or used by, any computing device. For example, the enhanced sound recording 224 might be provided to the a source device that provided the source sound recording 202 or a target device that provided the target sound recording 204. The source or target device may then present or play the enhanced sound recording. As another example, the enhanced sound recording 224 may he used or presented (e.g., played) via the sound enhancing component 210, or device associated therewith. Any device capable of playing audio can present such an enhanced sound recording.

Figure 4:
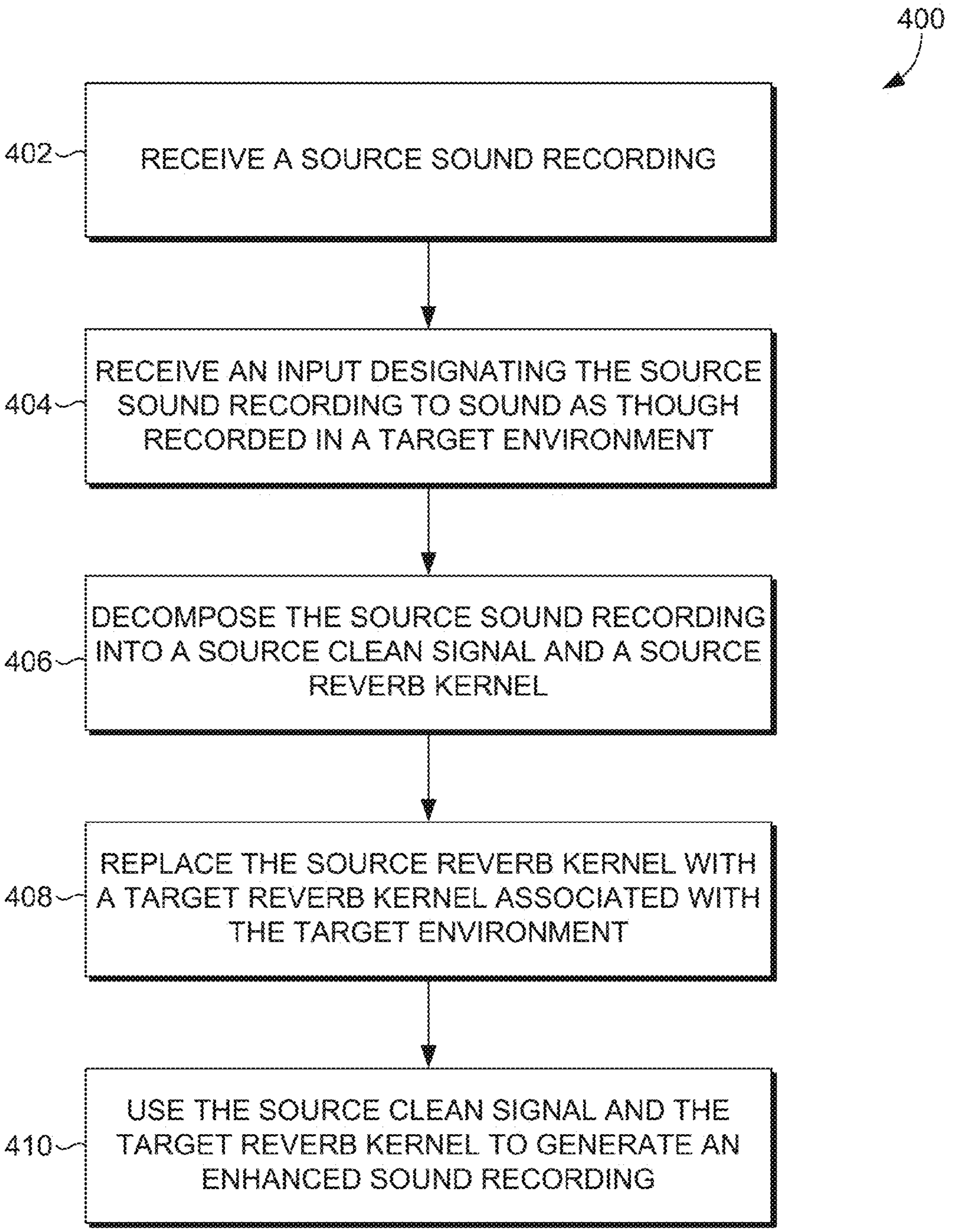
FIG. 4 is a flow diagram showing a method for performing sound enhancement through reverberation matching, in accordance with an embodiment of the present invention.

Turning now to FIG. 4, a flow diagram is provided that illustrates a method 400 for performing sound enhancement through reverberation matching, in accordance with an embodiment of the present invention. Although the method 400 of FIG. 4, the method 500 of FIG. 5, and the method 600 of FIG. 6 are provided as separate methods, the methods, or aspects thereof, can be combined into a single method or combination of methods. As can be appreciated, additional or alternative steps may also be included in different embodiments.

Initially, as illustrated at block 402, a source sound recording is received. The source sound recording can be, for example, received from a sound capturing device. At block 404, an input designating the source sound recording to sound as though recorded in a target environment is received. For example, a user may select to enhance the source sound recording to sound as though recorded in a target environment. At block 406, the source sound recording is decomposed into a source clean signal and a source reverb kernel. At block 408, the source reverb kernel is replaced with a target reverb kernel that is a reverb kernel associated with the target environment. In some cases, a target sound recording generated in the target environment is decomposed into a target clean signal and a target reverb kernel. The source clean signal and the target reverb kernel are used to generate an enhanced sound recording, as indicated at block 410.

Figure 5:
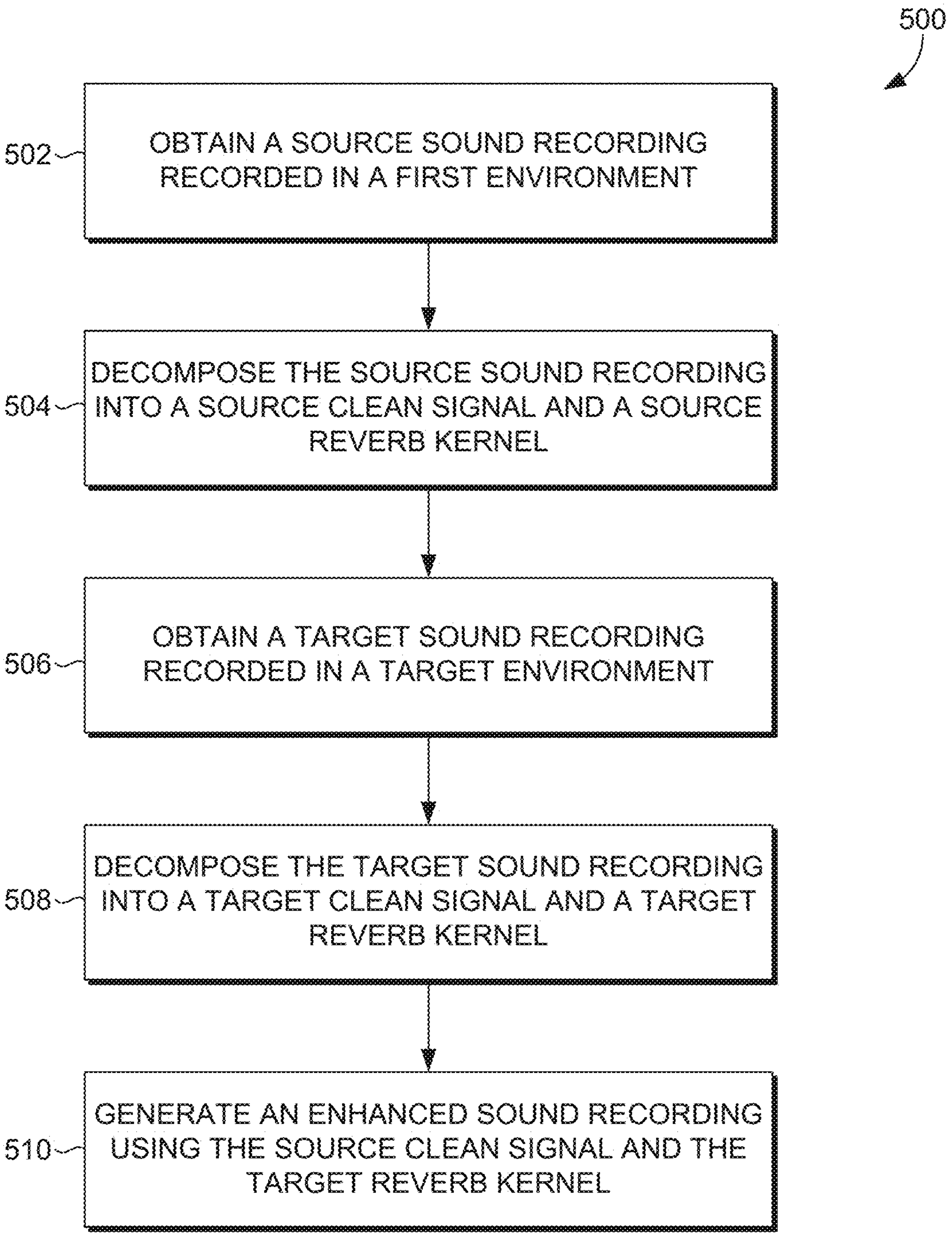
FIG. 5 is a flow diagram showing another method for performing sound enhancement through reverberation matching, in accordance with an embodiment of the present invention.
Figure 6:
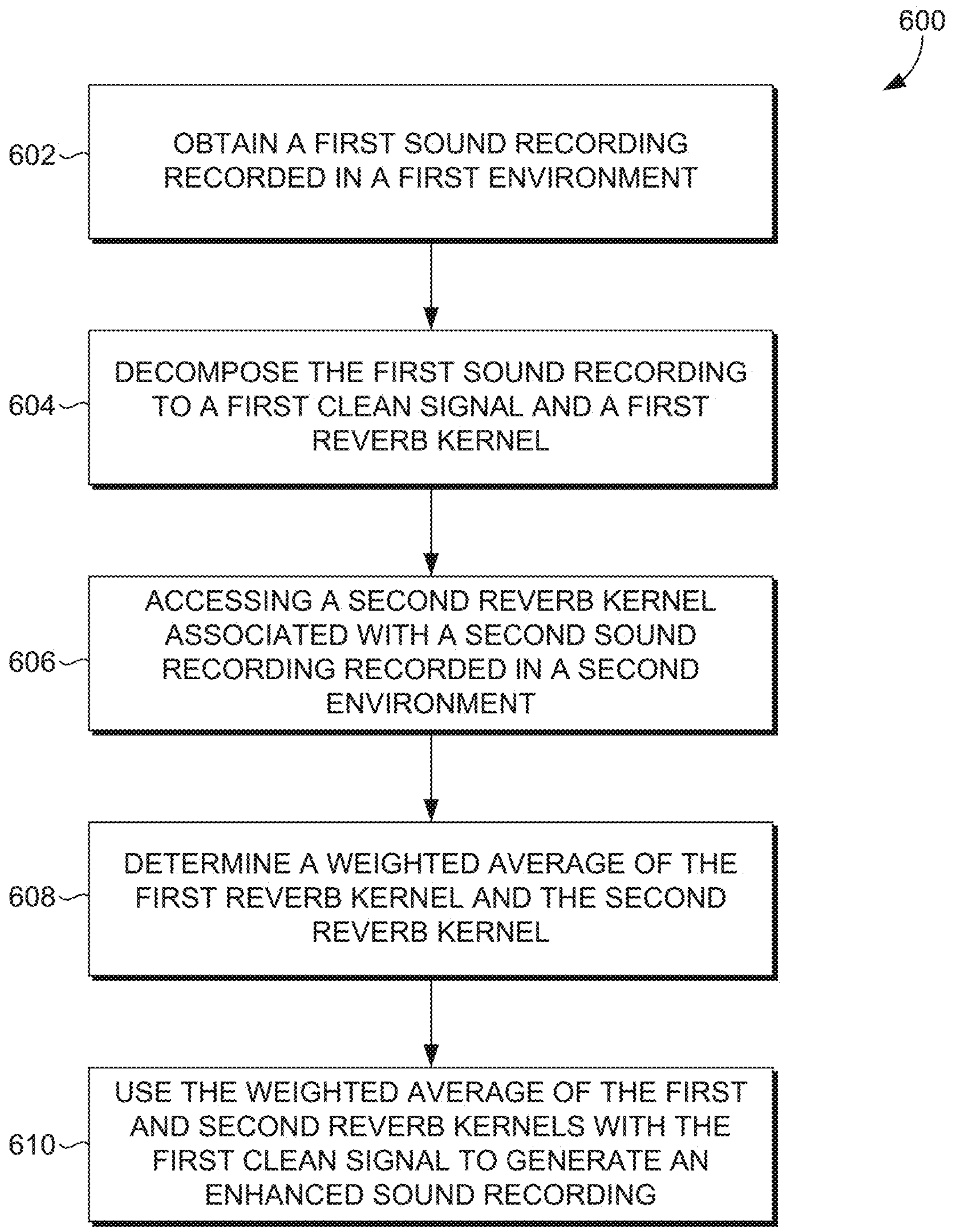
FIG. 6 is a flow diagram showing another method for performing sound enhancement through reverberation matching, in accordance with an embodiment of the present invention.

With respect to FIG. 5, a flow diagram is provided that illustrates a method 500 for performing sound enhancement through reverberation matching, in accordance with an embodiment of the present invention. Initially, at block 502, a source sound recording recorded in a first environment is obtained. Thereafter, at block 504, the source sound recording is decomposed into a source clean signal and a source reverb kernel. At block 506, a target sound recording recorded in a target environment is obtained. Thereafter, at block 508, the target sound recording is decomposed into a target clean signal and a target reverb kernel. The source and target sound recordings can be decomposed in any number of manners, such as by way of convolutive NMF. At block 510, the source clean signal is used along with the target reverb kernel to generate an enhanced sound recording that sounds as though the source recording was recorded in the target environment in which the target sound recording was recorded.

With reference to FIG. 6, a flow diagram is provided that illustrates a method 600 for performing sound enhancement through reverberation matching, in accordance with an embodiment of the present invention. Initially, as indicated at block 602, a first sound recording recorded in a first environment is obtained. At block 604, the first sound recording is decomposed to a first clean signal and a first reverb kernel. In accordance with a request to generate an enhanced sound recording that results in the first sound recording sounding as though recorded in a second environment, accessing a second reverb kernel decomposed, as described herein, from a second sound recording recorded in the second environment, as indicated at block 606. At block 608, a weighted average of the first reverb kernel and the second reverb kernel is determined. The weighted average can be determined based on any weights, for example, weights selected by a user. At block 610, the weighted average of the first and second reverb kernel is used with the first clean signal to generate an enhanced sound recording that sounds as though the first sound recording was recorded in the second environment.

Having described an overview of embodiments of the present invention, an exemplary computing environment in which some embodiments of the present invention may be implemented is described below in order to provide a general context for various aspects of the present invention.

Embodiments of the invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including handheld devices, consumer electronics, general-purpose computers, more specialty computing devices, etc. The invention may also be practiced in distributed computing environments where tasks are performed by remote-processing devices that are linked through a communications network.

Figure 7:
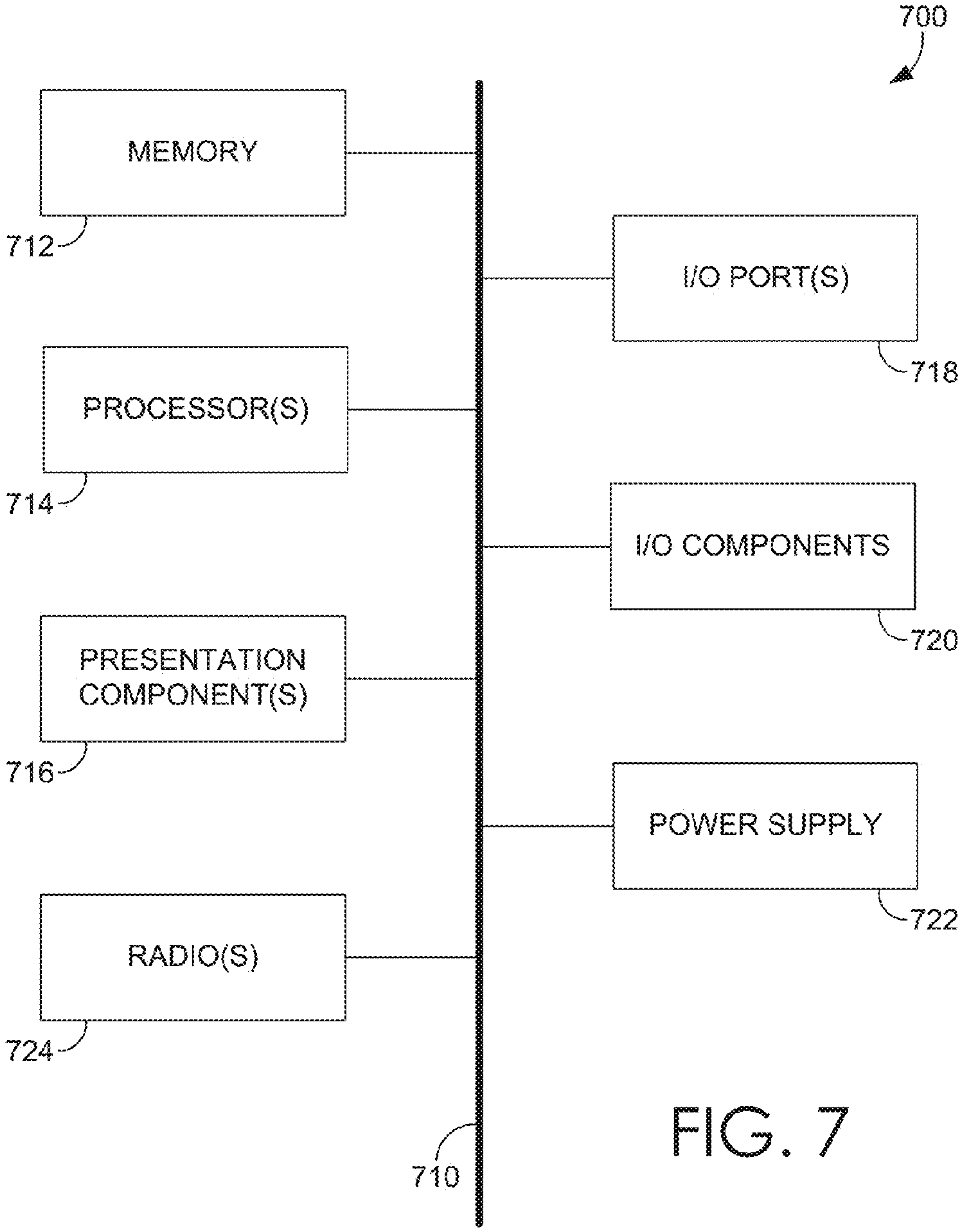
FIG. 7 is a block diagram of an exemplary computing environment in which embodiments of the invention may be employed.

Accordingly, referring generally to FIG. 7, an exemplary operating environment for implementing embodiments of the present invention is shown and designated generally as computing device 700. Computing device 700 is but one example of a suitable computing environment and is not intended to suggest any limitation as to the scope of use or functionality of the invention. Neither should the computing device 700 be interpreted as having any dependency or requirement relating to any one or combination of components illustrated.

With reference to FIG. 7, computing device 700 includes a bus 710 that directly or indirectly couples the following devices: memory 712, one or more processors 714, one or more presentation components 716, input/output (I/O) ports 718, input/output components 720 and an illustrative power supply 722. Bus 710 represents what may be one or more busses (such as an address bus, data bus, or combination thereof). Although the various blocks of FIG. 7 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors recognize that such is the nature of the art, and reiterates that the diagram of FIG. 7 is merely illustrative of an exemplary computing device that can he used in connection with one or more embodiments of the present invention. Distinction is not made between such categories as “workstation,” “server,” “laptop,” “hand-held device,” etc., as all are contemplated within the scope of FIG. 7 and reference to “computing device.”

Computing device 700 typically includes a variety of computer-readable media. Computer-readable media can be any available media that can be accessed by computing device 700 and includes both volatile and nonvolatile media, removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is riot limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 700. Computer storage media does not comprise signals per se. Communication media typically embodies computer-readable instructions, data structures, program modules or other data in a modulated data signal such as a carrier wave or other transport mechanism and includes any information delivery media. The teini “modulated data signal” means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 712 includes computer-storage media in the form of volatile and/or nonvolatile memory. The memory may be removable, non-removable, or a combination thereof. Exemplary hardware devices include solid-state memory, hard drives, optical-disc drives, etc. Computing device 700 includes one or more processors that read data from various entities such as memory 712 or I/O components 720. Presentation component(s) 716 present data indications to a user or other device. Exemplary presentation components include a display device, speaker, printing component, vibrating component, etc.

I/O ports 718 allow computing device 700 to be logically coupled to other devices including I/O components 720, some of which may he built in. Illustrative components include a microphone, joystick, game pad, satellite dish, scanner, printer, wireless device, etc. The I/O components 720 may provide a natural user interface (NUI) that processes air gestures, voice, or other physiological inputs generated by a user. In some instance, inputs may be transmitted to an appropriate network element for further processing. A NUI may implement any combination of speech recognition, touch and stylus recognition, facial recognition, biometric recognition, gesture recognition both on screen and adjacent to the screen, air gestures, head and eye tracking, and touch recognition associated with displays on the computing device 700. The computing device 700 may be equipped with depth cameras, such as, stereoscopic camera systems, infrared camera systems, RGB camera systems, and combinations of these for gesture detection and recognition. Additionally, the computing device 700 may be equipped with accelerometers or gyroscopes that enable detection of motion. The output of the accelerometers or gyroscopes may be provided to the display of the computing device 700 to render immersive augmented reality or virtual reality.

The present invention has been described in relation to particular embodiments, which are intended in all respects to be illustrative rather than restrictive. Alternative embodiments will become apparent to those of ordinary skill in the art to which the present invention pertains without departing from its scope.

What is claimed is:

1. A computer-implemented method for enhancing sound through reverberation matching, the method comprising:

receiving a first sound recording recorded in a first environment;

decomposing the first sound recording into a first clean signal and a first reverb kernel by iteratively updating each of an estimation of the first clean signal and an estimation of the first reverb kernel, wherein the first clean signal is indicated by a first factor of a first matrix based on the first sound recording and the first reverb kernel is indicated by a second factor of the first matrix;

accessing a second reverb kernel decomposed from a second sound recording recorded in a second environment; and generating an enhanced sound recording based on the first clean signal and the second reverb kernel, wherein the enhanced sound recording is a modification of the first sound recording to sound as though recorded in the second environment.

2. The method of claim 1, wherein an initial estimation of the first clean signal is based on one or more positive random numbers, an initial estimation of the first reverb kernel is based on a statistical reverb model, and the first sound recording is decomposed using a convolutive non-negative matrix factorization.

3. The method of claim 1 further comprising:

receiving the second sound recording recorded in the second environment; and decomposing the second sound recording into a second clean signal and the second reverb kernel by iteratively updating each of an estimation of the second clean signal and an estimation of the second reverb kernel, wherein the second clean signal is indicated by a first factor of a second matrix based on the second sound recording and the second reverb kernel is indicated by a second factor of the second matrix.

4. The method of claim 1, wherein the first clean signal comprises a signal with reverberation substantially removed and the first reverb kernel comprises reverberation associated with the first sound recording.

5. One or more non-transitory computer storage media storing computer-useable instructions that, when used by a computing device, cause the computing device to perform a method, the method comprising:

obtaining a first sound recording recorded in a first environment and a second sound recording recorded in a second environment, wherein the first sound recording includes a first reverberation and the second sound recording includes a second reverberation;

determining a first matrix factor and a second matrix factor of a first matrix based on the first sound recording, wherein the first matrix factor indicates a first clean signal of the first sound recording and the second matrix factor indicates a first reverb kernel that corresponds to the first reverberation of the first sound recording;

determining a third matrix factor and a fourth matrix factor of a second matrix based on the second sound recording, wherein the third matrix factor indicates a second clean signal of the second sound recording and the fourth matrix factor indicates a second reverb kernel that corresponds to the second reverberation; and in response to a selection to match the first sound recording to the second reverberation, generating an enhanced sound recording using the first matrix factor indicating the first clean signal of the first sound recording and the fourth matrix factor indicating the second reverb kernel corresponding to the second reverberation of the second sound recording.

6. The one or more computer storage media of claim 5, wherein each of the first matrix factor, the second matrix factor, the third matrix factor, and the fourth matrix factor is determined using a convolutive non-negative matrix factorization.

7. The one or more computer storage media of claim 5, wherein the enhanced sound recording is generated using a convolution between the first matrix factor indicating the first clean signal of the first sound recording and the fourth matrix factor indicating the second reverb kernel that corresponds to the second reverberation of the second sound recording.

8. A system for facilitating sound enhancement, the system comprising:

one or more processors; and a memory coupled with the one or more processors, the memory having instructions stored thereon that, when executed by the one or more processors, cause the computer system to:

decompose a source sound recording recorded in a source environment into a source clean signal and a source reverb kernel that corresponds to a source reverberation of the source sound recording;

decompose a target sound recording recorded in a target environment into a target clean signal and a target reverb kernel that corresponds to a target reverberation of the target source recording;

determine a weighted reverb kernel based on the source reverb kernel, the target reverb kernel, and one or more weights associated with at least one of the source reverb kernel or the target reverb kernel;

generate an enhanced sound recording using the source clean signal and the weighted reverb kernel, wherein the enhanced sound recording matches the source clean signal to a weighted average of the source reverberation of the source sound recording and the target reverberation of the target environment sound recording.

9. The method of claim 1, further comprising:

determining a weighted reverb kernel based on the first reverb kernel, the second reverb kernel, and one or more weights associated with at least one of the first reverb kernel or the second reverb kernel; and generating the enhanced sound recording based on a convolution of the first clean signal and the weighted reverb kernel.

10. The method of claim 9, further comprising:

employing a blind estimation to determine a first reverberation time based on the first sound recording;

employing the blind estimation to determine a second reverberation time based on the second sound recording; and automatically determining the one or more weights based on each of the first reverberation time and the second reverberation time.

11. The method of claim 1, further comprising:

generating a convolution of the first clean signal and the second reverb kernel;

transforming the convolution of the first clean signal and the second reverb kernel into a time domain based on phase information included in the first sound recording; and generating the enhanced sound recording further based on the transformed convolution of the first clean signal and the second reverb kernel.

12. The method of claim 11, wherein a short-time Fourier Transformation is employed to transform the convolution of the first clean signal and the second reverb kernel into the time domain.

13. The one or more computer storage media of claim 5, wherein each of the first and the second matrix factors are determined iteratively and an initial determination of the first matrix factor includes positive random numbers and an initial determination of the second matrix factor is based on a statistical reverb model.

14. The one or more computer storage media of claim 5, the method further comprising:

determining a weighted reverb matrix based on the second matrix factor, the fourth matrix factor, and one or more weights associated with at least one of the second matrix factor or the fourth matrix factor; and generating the enhanced sound recording based on a convolution of the first matrix factor and the weighted matrix factor.

15. The one or more computer storage media of claim 14, the method further comprising:

employing a blind estimation to determine a first reverberation time of the first reverberation based on the first sound recording;

employing the blind estimation to determine a second reverberation time of the second reverberation based on the second sound recording; and automatically determining the one or more weights based on each of the first reverberation time and the second reverberation time.

16. The one or more computer storage media of claim 7, the method further comprising:

transforming the convolution of the first matrix factor and the fourth matrix factor into a time domain based on phase information included in the first sound recording and a short-time Fourier Transformation; and generating the enhanced sound recording further based on the transformed convolution of the first matrix factor and the fourth matrix factor.

17. The system of claim 8, wherein when executed by the one or more processes, the instructions further cause to computer to:

employ a blind estimation to determine a source reverberation time for the source reverberation based on the source sound recording;

employ the blind estimation to determine a target reverberation time for the target reverberation based on the target sound recording; and automatically determining the one or more weights based on each of the source reverberation time and the target reverberation time.

18. The system of claim 8, wherein decomposing the source sound recording into the source clean signal and the source reverb kernel includes iteratively updating each of an estimation of the source clean signal and an estimation of the source reverb kernel based on a source matrix based on the source sound recording, and wherein decomposing the target sound recording into the target clean signal and the target reverb kernel includes iteratively updating each of an estimation of the target clean signal and an estimation of the target reverb kernel based on a target matrix based on the target sound recording.

19. The system of claim 18, wherein an initial estimation of the source clean signal is based on one or more positive random numbers and an initial estimation of the source reverb kernel is based on a statistical reverb model.

20. The system of claim 8, wherein when executed by the one or more processes, the instructions further cause to computer to:

generating a convolution of the source clean signal and the weighted reverb kernel;

transforming the convolution of the source clean signal and the weighted reverb kernel into a time domain based on phase information included in the source sound recording; and generating the enhanced sound recording further based on the transformed convolution of the source clean signal and the weighted reverb kernel.

* * * * *